United States Patent
Huang (10) Patent No.: US 9,916,905 B2
(45) Date of Patent: Mar. 13, 2018

(54) DISPLAY PANEL AND BI-DIRECTIONAL SHIFT REGISTER CIRCUIT

(71) Applicant: InnoLux Corporation, Miao-Li County (TW)

(72) Inventor: Sheng-Feng Huang, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 124 days.

(21) Appl. No.: 14/873,683

(22) Filed: Oct. 2, 2015

(65) Prior Publication Data
US 2016/0104449 A1  Apr. 14, 2016

(30) Foreign Application Priority Data

Oct. 9, 2014 (TW) .............................. 103135166 A (51) Int. Cl.
G09G 5/00 (2006.01)
G11C 19/28 (2006.01)
G09G 3/36 (2006.01)

(52) U.S. Cl.
CPC ........... *G11C 19/28* (2013.01); *G09G 3/3688* (2013.01); *G11C 19/287* (2013.01); *G09G 2310/0283* (2013.01); *G09G 2310/0286* (2013.01); *G09G 2310/08* (2013.01); *G09G 2340/0492* (2013.01)

(58) Field of Classification Search
CPC .... G11C 19/28; G11C 19/287; G09G 3/3688; G09G 2310/0283; G09G 2310/08; G09G 2310/0286; G09G 2340/0492
USPC ........................................................ 345/212
See application file for complete search history.

(56) References Cited

U.S. PATENT DOCUMENTS

| | | | | |
|---|---|---|---|---|
| 2007/0274432 | A1* | 11/2007 | Yu | G11C 19/28 377/64 |
| 2008/0012818 | A1* | 1/2008 | Lee | G09G 3/3677 345/100 |
| 2011/0199354 | A1* | 8/2011 | Iwase | G09G 3/3677 345/208 |
| 2013/0257703 | A1* | 10/2013 | Huang | G11C 19/28 345/100 |

(Continued)

OTHER PUBLICATIONS

Chinese language office action dated Mar. 14, 2016, issued in application No. TW 103135166.

*Primary Examiner* — Srilakshmi K Kumar
*Assistant Examiner* — Chineyere Wills-Burns
(74) *Attorney, Agent, or Firm* — McClure, Qualey & Rodack, LLP (57) ABSTRACT

A display panel includes shift registers coupled in serial. At least one of the shift registers includes an input circuit, an output circuit and a control circuit. The input circuit is coupled to a first input terminal and a second input terminal for respectively receiving a first input signal and a second input signal. The output circuit is coupled to a first clock input terminal for receiving a first clock signal and outputting a pulse signal at an output terminal according to the first clock signal. The control circuit is coupled to the output circuit via a first control node, a second control node and a third control node and controls voltages at the first control node, the second control node and the third control node according to the first input signal or the second input signal, and further controls operations of the output circuit.

17 Claims, 8 Drawing Sheets

(56) References Cited

U.S. PATENT DOCUMENTS

| | | | | |
|---|---|---|---|---|
| 2013/0265291 A1* | 10/2013 | Huang | ................. | G11C 19/287 |
| | | | | 345/212 |
| 2014/0184304 A1* | 7/2014 | Huang | .................... | G09G 3/20 |
| | | | | 327/379 |
| 2015/0294734 A1* | 10/2015 | Chan | ..................... | G11C 19/28 |
| | | | | 327/109 |

* cited by examiner

DISPLAY PANEL AND BI-DIRECTIONAL SHIFT REGISTER CIRCUIT

CROSS REFERENCE TO RELATED APPLICATIONS

This Application claims priority of Taiwan Patent Application No. 103135166, filed on Oct. 9, 2014, the entirety of which is incorporated by reference herein.

BACKGROUND OF THE INVENTION

Field of the Invention

The invention relates to bi-directional shift registers, and more particularly to bi-directional shift registers capable of reducing the falling time of an output pulse and reducing the power consumption.

Description of the Related Art

Shift registers have been widely used in data driving circuits and gate driving circuits used in display devices to control timing when receiving a data signal in each data line, as well as to generate a scanning signal for each gate line. In a data driving circuit, the shift register outputs a selection signal to each data line, so as to write the image data into each data line. In a gate driving circuit, the shift register outputs a scanning signal to each gate line, so as to write the image signal provided to each data line in the pixels of a pixel array.

A conventional shift register generates the selection signal or scanning signal in only a single direction. However, a single scanning direction does not satisfy the entire requirements of LCD products. For example, some displays of digital cameras are rotated according to the placement angle of the camera. In addition, some LCD monitors comprise the function of rotating the monitor. Therefore, novel bi-directional shift registers capable of outputting signals in a forward direction and a reverse direction, and further reducing the falling time of an output pulse and reducing the power consumption, are highly desired.

BRIEF SUMMARY OF THE INVENTION

A display panel and a bi-directional shift register circuit are provided. An exemplary embodiment of the display panel comprises a gate driving circuit. The gate driving circuit comprises a plurality of shift registers coupled in serial. At least one of the shift registers comprises an input circuit, an output circuit, and a control circuit. The input circuit is coupled to a first input terminal and a second input terminal for respectively receiving a first input signal and a second input signal. The output circuit is coupled to a first clock input terminal for receiving a first clock signal and outputting a pulse signal at an output terminal according to the first clock signal. The control circuit is coupled to the output circuit via a first control node, a second control node and a third control node and controls voltages at the first control node, the second control node and the third control node according to the first input signal or the second input signal, and further controls operations of the output circuit.

An exemplary embodiment of a bi-directional shift register circuit generates a plurality of gate driving signals and comprises a plurality of shift registers. At least one shift register comprises an input circuit, an output circuit, a control circuit, a second clock input terminal and a third clock input signal. The input circuit is coupled to a first input terminal and a second input terminal for respectively receiving a first input signal and a second input signal. The output circuit is coupled to a first clock input terminal for receiving a first clock signal and outputs a pulse signal at an output terminal according to the first clock signal. The control circuit is coupled to the output circuit via a first control node, a second control node and a third control node and controls voltages at the first control node, the second control node and the third control node according to the first input signal or the second input signal, and further controls operations of the output circuit. The second clock input terminal receives a second clock signal. The third clock input signal receives a third clock signal. When the shift register operates in a forward scan, the falling edge of the first clock signal is close to the rising edge of the second clock signal, and when the shift register operates in a reverse scan, the falling of the first clock signal is close to the rising edge of the third clock signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
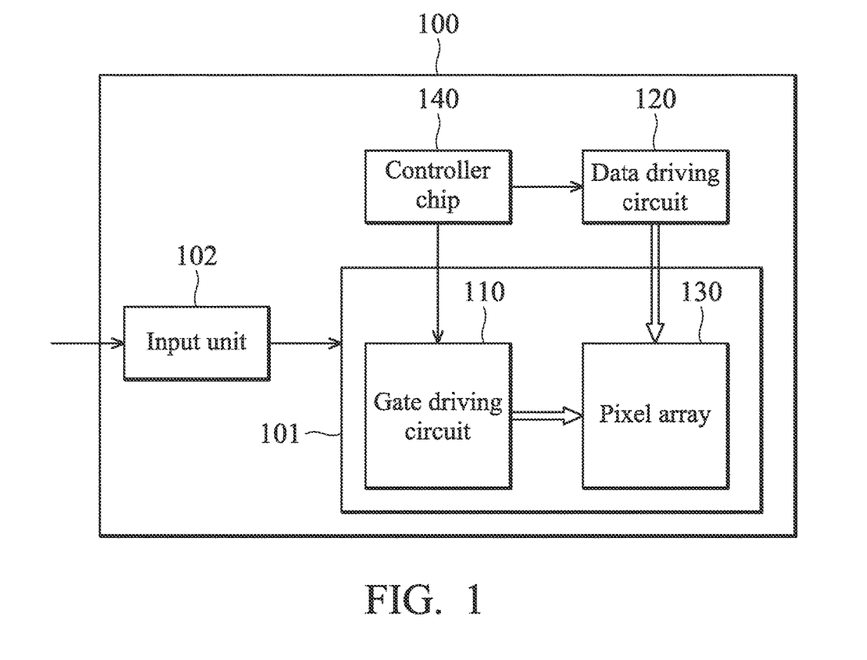
FIG. 1 is a block diagram of a display device according to an embodiment of the invention.

FIG. 1 is a block diagram of a display device according to an embodiment of the invention. As shown in FIG. 1, the display device 100 may comprise a display panel 101, a data driving circuit 120 and a controller chip 140. The display panel 101 may comprise a gate driving circuit 110 and a pixel array 130. The gate driving circuit 110 generates a plurality of gate driving signals to drive a plurality of pixels in the pixel array 130. The data driving circuit 120 generates a plurality of data driving signals to provide image data to the pixels of the pixel array 130. The controller chip 140 generates a plurality of timing signals, comprising clock signals, reset signals and start pulses.

In addition, the display device 100 may further comprise an input unit 102. The input unit 102 receives image signals and controls the display panel 101 to display images. According to an embodiment of the invention, the display device 100 may further be comprised in an electronic device. The electronic device may be implemented as various devices, comprising: a mobile phone, a digital camera, a personal digital assistant (PDA), a lap-top computer, a personal computer, a television, an in-vehicle display, a portable DVD player, or any apparatus with image display functionality.

According to an embodiment of the invention, the gate driving circuit 110 may be designed as a unilateral gate driving circuit and disposed at one side of the pixel array 130, or may be designed as a bilateral gate driving circuit and disposed at two sides of the pixel array, and the invention should not be limited to either implementation method.

In addition, according to an embodiment of the invention, according to the unilateral or bilateral design, the gate driving circuit may comprise one or more shift register circuits. The shift register circuit may be a bi-directional shift register circuit for supporting the operations of two different scan directions (the forward scan and reverse scan). In the embodiments of the invention, the bi-directional shift register circuit may comprise a plurality of shift registers SR coupled in serial. Each shift register may sequentially generate a gate driving signal to one gate line for driving the pixels on each gate line. For example, when the bi-directional shift register circuit operates in the forward scan, the shift registers sequentially output the corresponding gate driving signals in a first order, such as SR(1)~SR(M), where M is the number of shift registers, and when the bi-directional shift register circuit operate in the reverse scan, the shift registers sequentially output the corresponding gate driving signals in a second order, such as SR(M)~SR(1).

Generally, when the resolution of the display panel increases, the number of shift register increases, accordingly. However, once the number of shift register increases, the loading of the clock signals provided to the shift register circuit increases, causing a distortion problem in the clock signals received by the shift register in the far end.

Figure 2:
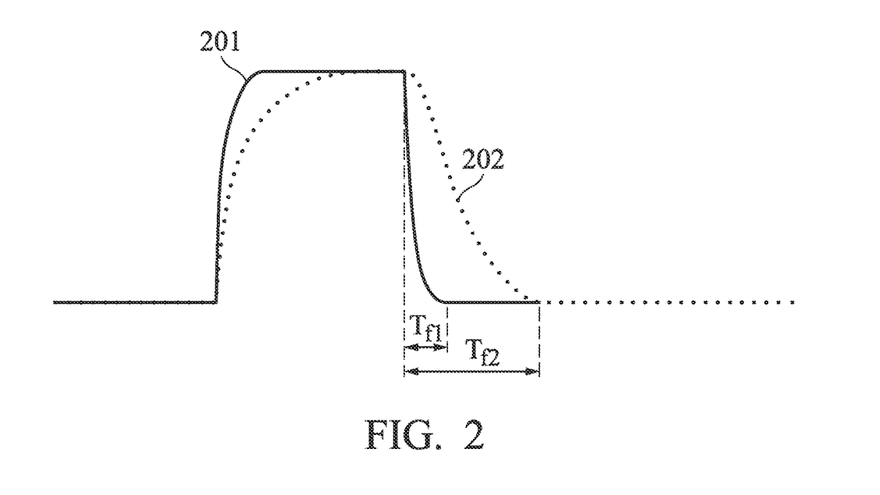
FIG. 2 shows an exemplary waveform of a clock signal.

FIG. 2 shows an exemplary waveform of a clock signal. The waveform 201 represents the clock signal received by a near end shift register and the waveform 202 represents the clock signal received by a far end shift register. Here, the near end and far end represents the relative distance between the shift register and the controller chip providing the clock signals. As shown in FIG. 2, the falling time $T_{f2}$ of the clock pulse received by the far end shift register is longer than the falling time $T_{f1}$ of the clock pulse received by the near end shift register. However, the falling edge of the clock pulse is an important timing for reading the image data, especially when the clock signal is designed to have a pulse width of multiple horizontal times. Therefore, the falling time of the clock pulse is as short as possible.

Figure 4:
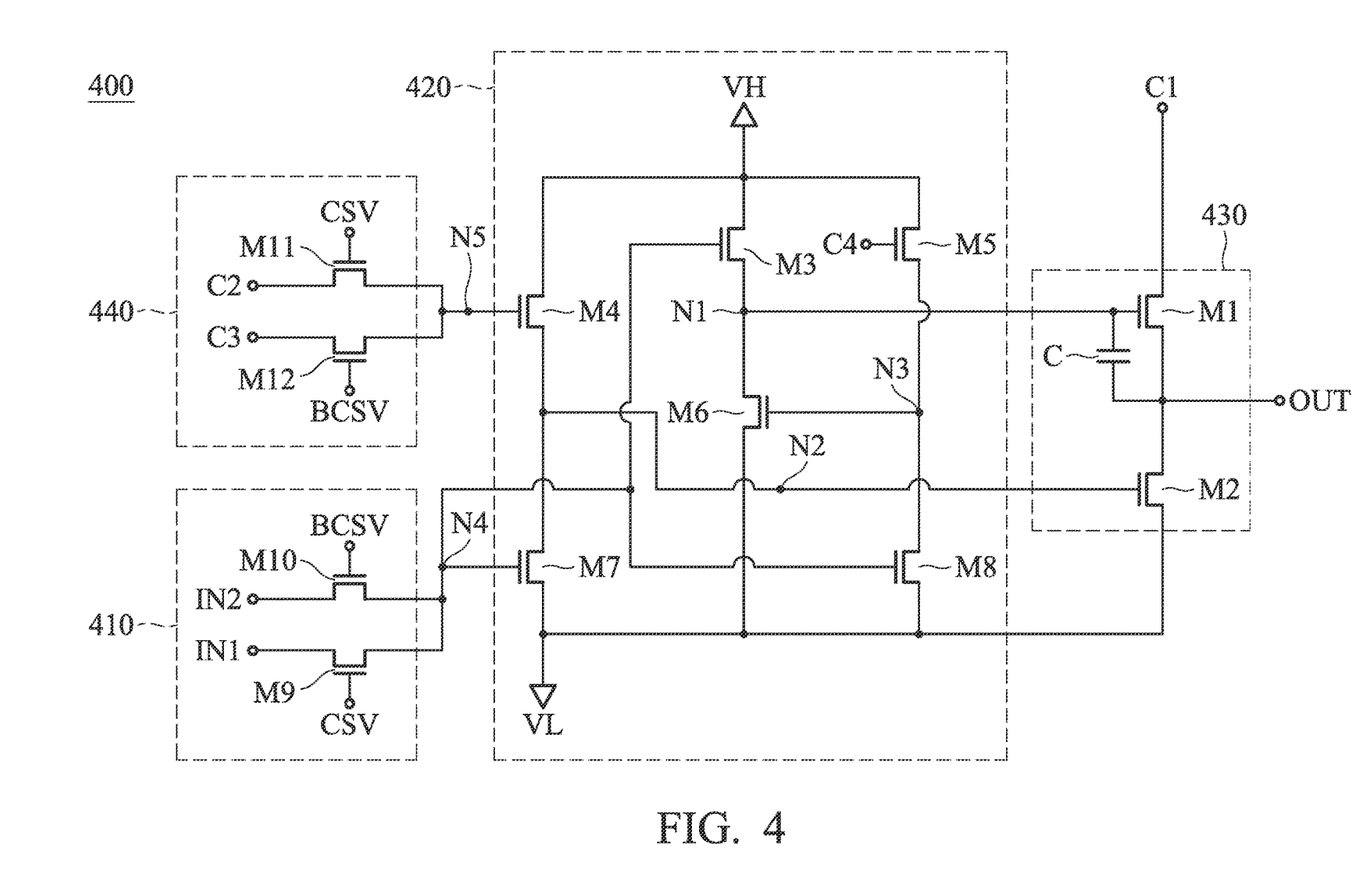
FIG. 4 shows a circuit diagram of a shift register circuit according to a first embodiment of the invention.
Figure 7:
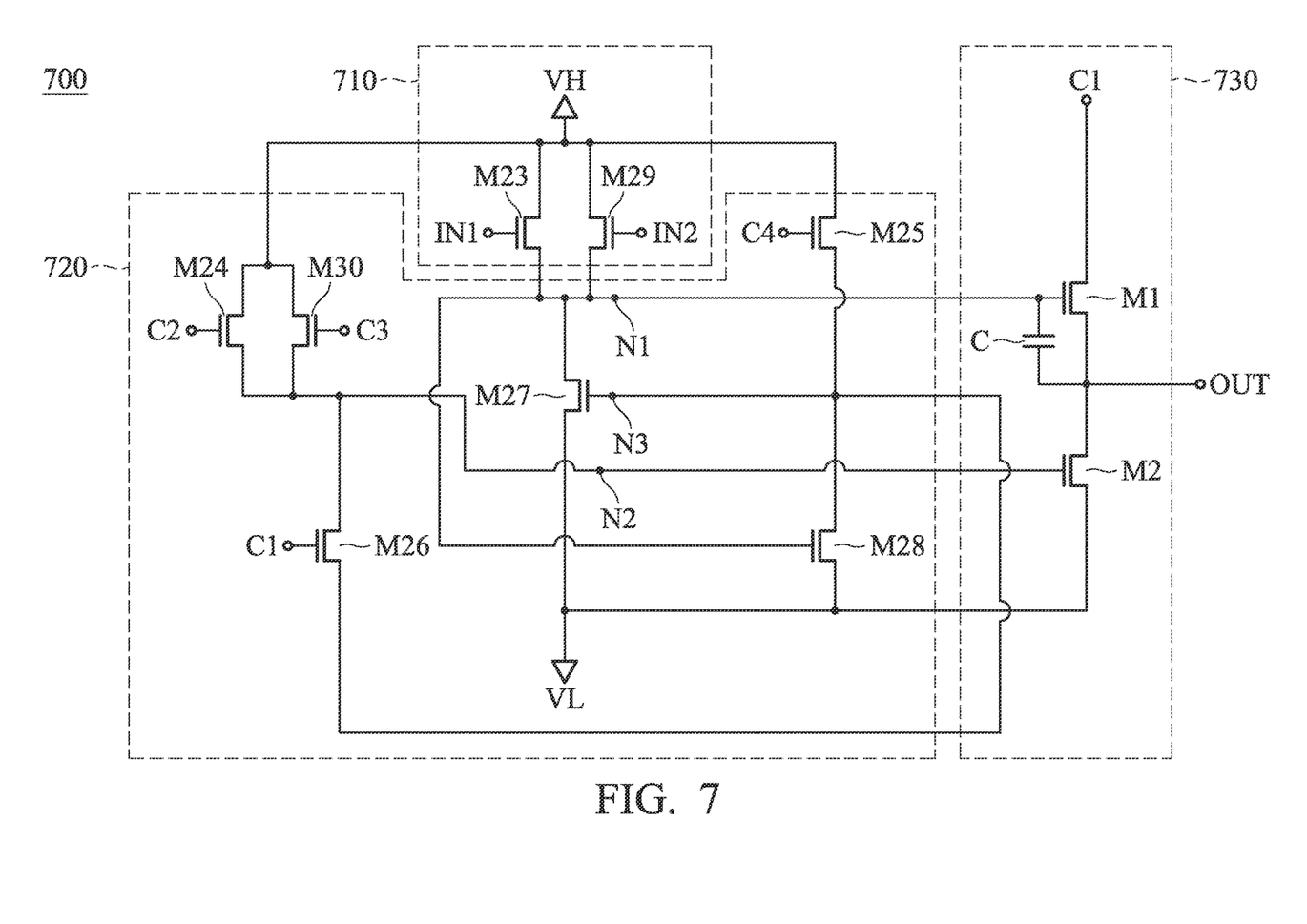
FIG. 7 shows a circuit diagram of a shift register circuit according to a second embodiment of the invention.

In this manner, the size of the transistor (for example, the transistor M1 in the embodiment as shown in FIGS. 4 and 7) outputting one pulse of the clock signal as the gate pulse in conventional design cannot be reduced, so as to prevent extending the falling time of the gate pulse. However, the big size transistor M1 increases the circuit area and consumes more power. To solve this problem, a bi-directional shift registers capable of reducing power consumption and the falling time of the gate pulse are proposed. The proposed bi-directional shift registers are further discussed in the following paragraphs.

Figure 3:
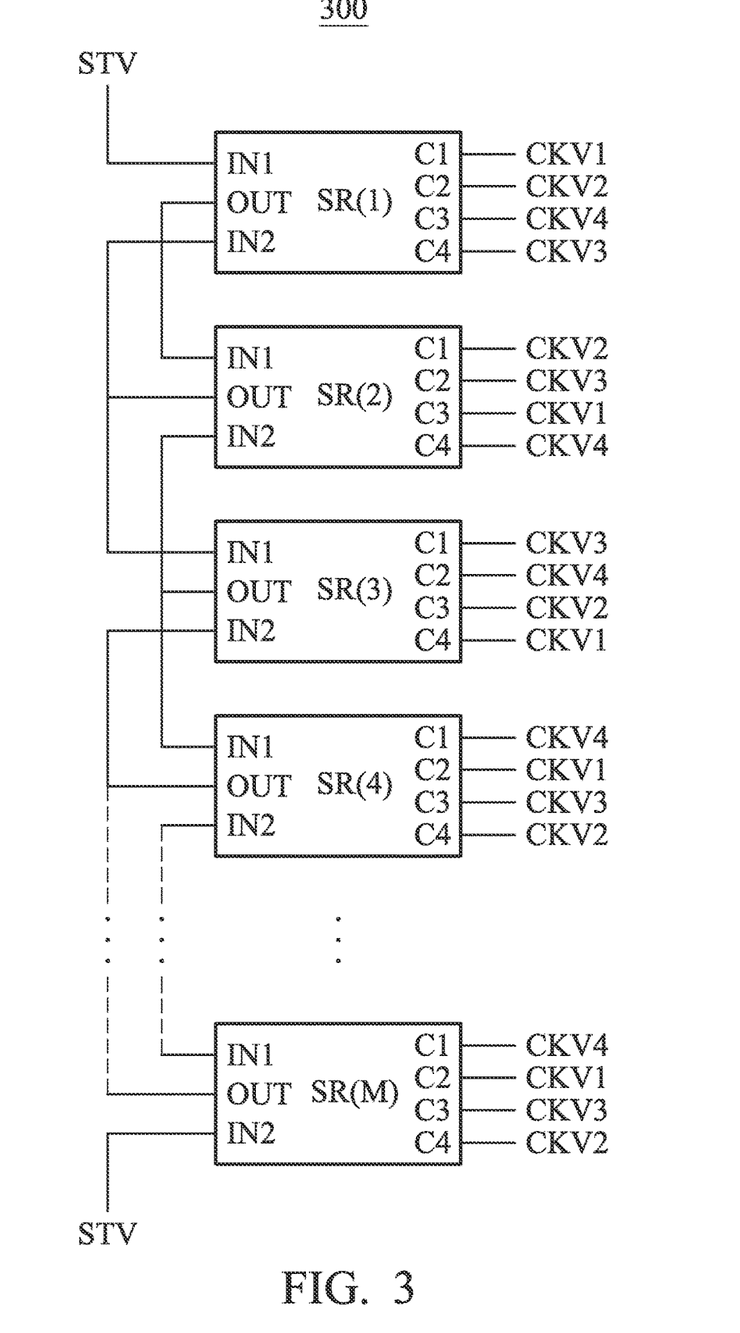
FIG. 3 shows a block diagram of a bi-directional shift register circuit according to an embodiment of the invention.

FIG. 3 shows a block diagram of a bi-directional shift register circuit according to an embodiment of the invention. As shown in FIG. 3, the bi-directional shift register circuit 300 may comprise a plurality of shift registers SR(1)~SR (M) coupled in serial. Each shift register may at least comprise a first input terminal IN1, a second input terminal IN2, an output terminal OUT, a first clock input terminal C1, a second clock input terminal C2, a third clock input terminal C3 and a fourth clock input terminal. The first stage shift register SR(1) receives the start pulse STV at the first input terminal IN1 as the first input signal, and the remaining stage shift registers SR(2)~SR(M) respectively receive the gate pulse output by a previous stage shift register SR(1)~SR(M−1) at the first input terminal IN1 as the first input signal. The last stage shift register SR(M) receives the start pulse STV at the second input terminal IN2 as the second input signal, and the remaining stage shift registers SR(M−1)~SR(1) respectively receive the gate pulse output by a following stage shift register SR(M)—SR(2) at the second input terminal IN2 as the second input signal.

Figure 5:
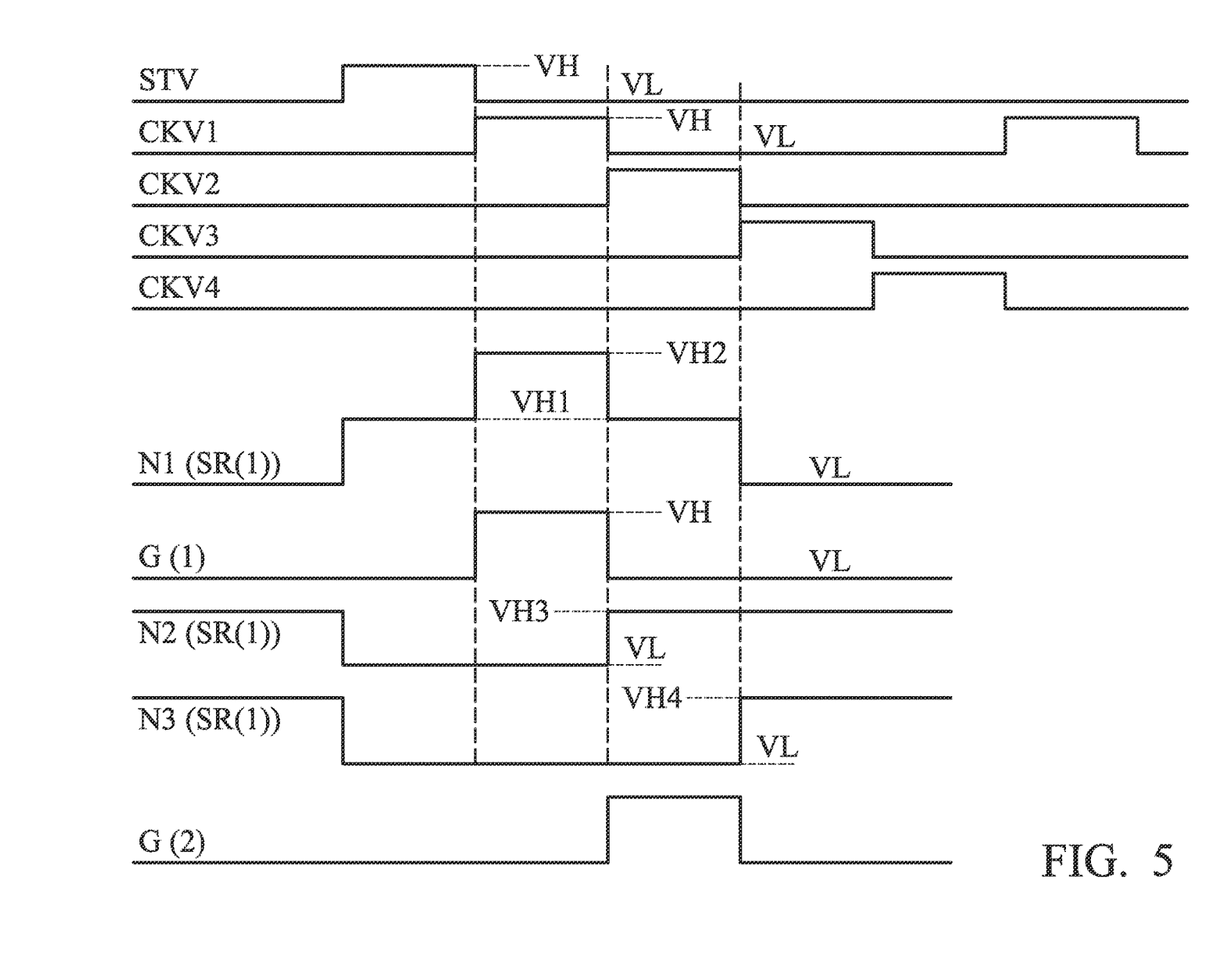
FIG. 5 shows the waveforms of the corresponding signals and nodes of a shift register in the forward scan according to the first embodiment of the invention.
Figure 6:
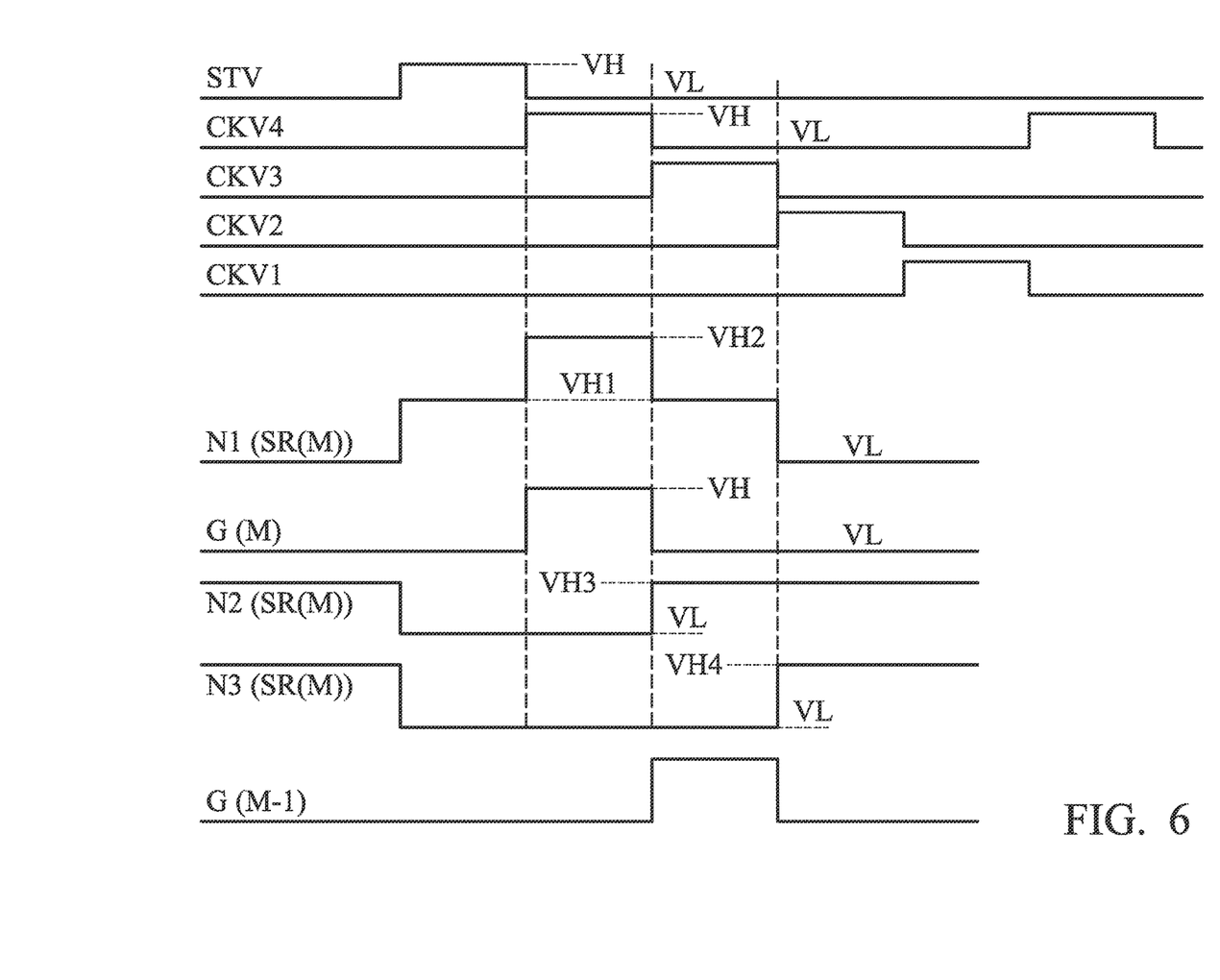
FIG. 6 shows the waveforms of the corresponding signals and nodes of a shift register in the reverse scan according to the first embodiment of the invention.
Figure 8:
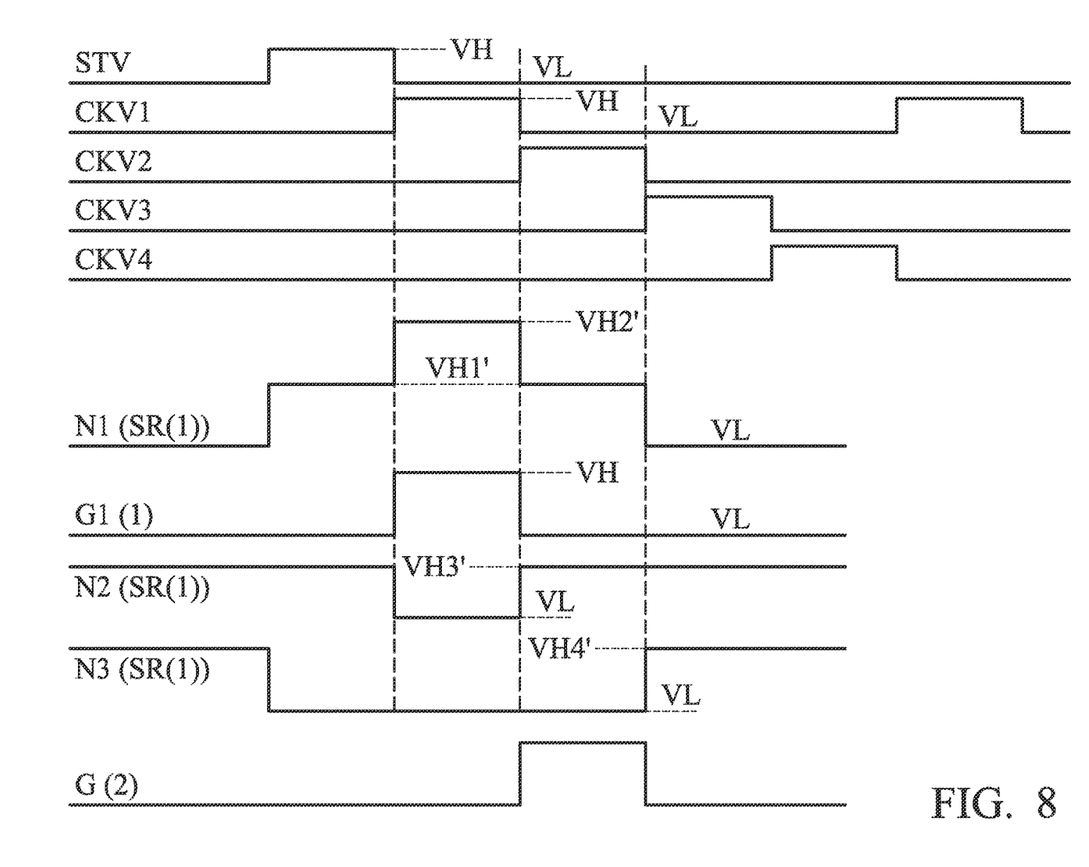
FIG. 8 shows the waveforms of the corresponding signals and nodes of a shift register in the forward scan according to the second embodiment of the invention.
Figure 9:
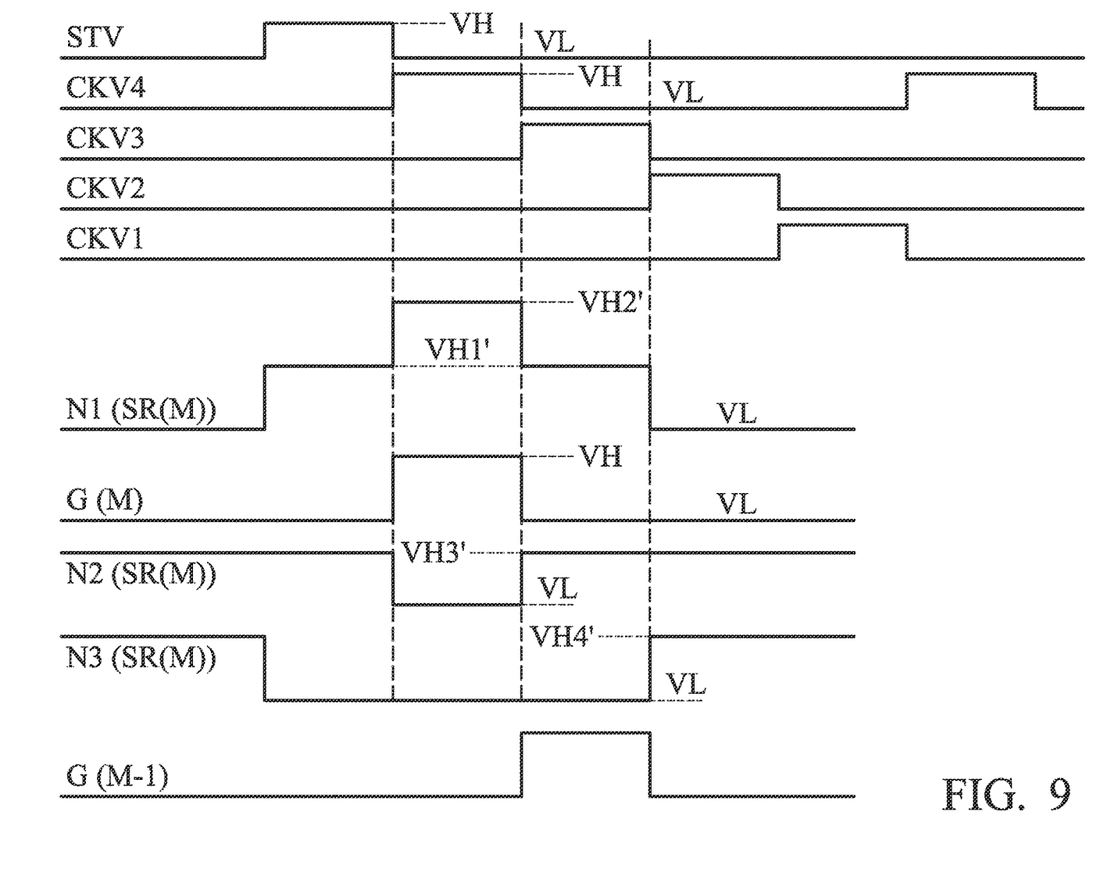
FIG. 9 shows the waveforms of the corresponding signals and nodes of a shift register in the reverse scan according to the second embodiment of the invention.

In addition, according to an embodiment of the invention, each shift register may receive at least four clock signals. For example, the clock signals CKV1, CKV2, CKV3 and CKV4 as shown. As shown in FIG. 3, each shift register may receive the clock signal at each clock input terminals according to a predetermined rule. In the embodiments of the invention, the rising edge of a clock signal is close to the falling edge of the next clock signal. In addition, in a forward scan, the pulse of the clock signals CKV1~CKV4 are sequentially generated in a cyclic manner and in a reverse scan, the pulse of the clock signals CKV4~CKV1 are sequentially generated in a cyclic manner. As shown in FIG. 5 and FIG. 8, in a forward scan, the rising edge of the clock signal CKV1 is close to the falling edge of the clock signal CKV4, the rising edge of the clock signal CKV2 is close to the falling edge of the clock signal CKV1, and so on, and the pulse of the clock signals CKV1~CKV4 are sequentially generated in a cyclic manner. In addition, as shown in FIG. 6 and FIG. 9, in reverse scan, the rising edge of the clock signal CKV4 is close to the falling edge of the clock signal CKV1, the rising edge of the clock signal CKV3 is close to the falling edge of the clock signal CKV4, and so on, and the pulse of the clock signals CKV4~CKV1 are sequentially generated in a cyclic manner.

In addition, according to an embodiment of the invention, in the forward scan, each shift register is activated in response to the first input signal received at the first input terminal IN1, and is deactivated in response to the clock signal received at the fourth clock input terminal C4. In the reverse scan, operation of each shift register is activated in response to the second input signal received at the second input terminal IN2, and is deactivated in response to the clock signal received at the fourth clock input terminal C4. Multiple shift register circuits are discussed in detail in the following paragraphs.

FIG. 4 shows a circuit diagram of a shift register circuit according to a first embodiment of the invention. The shift register 400 may be either one of the shift registers SR(1)~SR(M) shown in FIG. 3, and may comprise an input circuit 410, a control circuit 420, an output circuit 430 and a switch circuit 440. For the convenience of illustration, the shift register 400 is regarded as the first stage shift register SR(1).

The input circuit 410 is coupled to a first input terminal IN1 and a second input terminal IN2 for respectively receiving the input signal STV and G(2) (that is, the gate driving signal output by a following stage shift register SR(2)). The output circuit 430 is coupled to the first clock input terminal C1 for receiving the clock signal CKV1 and outputs a pulse signal (that is, the gate pulse of the gate driving signal G(1)) at the output terminal OUT according to the clock signal CKV1. The control circuit 420 is coupled to the output circuit 430 through the first control node N1, the second control node N2 and the third control node N3, controls the voltages at the first control node N1, the second control node N2 and the third control node N3 according to the input signal STV or G(2), and further controls the operation of the output circuit 430. The switch circuit 440 is coupled to the second clock input terminal C2 and the third clock input terminal C3 for receiving the clock signals CKV2 and CKV4.

In this embodiment, the input circuit 410 and the switch circuit 440 further receive two control signals CSV and BCSV. The control signals CSV and BCSV are utilized to define the scan direction. For example, when operating in the forward scan, the control signal CSV has a first voltage level and the control signal BCSV has a second voltage level. Meanwhile, the input circuit 410 only transmits the input signal STV to the control circuit 420 and the switch circuit 440 only transmits the clock signal CKV2 to the control circuit 420. When operating in the reverse scan, the control signal has the second voltage level and the control signal BCSV has the first voltage level. Therefore, the input circuit 410 only transmits the input signal G(2) to the control circuit 420 and the switch circuit 440 only transmits the clock signal CKV4 to the control circuit 420.

According to an embodiment of the invention, the output circuit 430 may comprise transistors M1, M2 and a capacitor C. The transistor M1 is coupled between the first clock input terminal C1 and the output terminal OUT and comprises a control electrode coupled to the first control node N1. The transistor M2 is coupled between the output terminal OUT and the low operation voltage VL and comprises a control electrode coupled to the second control node N2. The transistor M1 is turned on or off according to a voltage at the first control node N1 and the transistor M2 is turned on or off according to a voltage at the second control node N2.

The control circuit 420 may comprise transistors M3~M8. The transistor M3 is coupled between the high operation voltage VH and the first control node N1 and comprises a control electrode coupled to the fourth control node N4. The transistor M3 is turned on or off according to a voltage at the fourth control node N4 for controlling the voltage at the first control node N1. The transistor M4 is coupled between the high operation voltage VH and the second control node N2 and comprises a control electrode coupled to the fifth control node N5. The transistor M4 is turned on or off according to a voltage at the fifth control node N5 for controlling the voltage at the second control node N2. The transistor M5 is coupled between the high operation voltage VH and the third control node N3 and comprises a control electrode coupled to the fourth clock input terminal C4. The transistor M5 is turned on or off according to a voltage of the clock signal CKV3 for controlling the voltage at the third control node N3.

The transistor M6 is coupled between the first control node N1 and the low operation voltage VL and comprises a control electrode coupled to the third control node N3. The transistor M6 is turned on or off according to the voltage at the third control node N3 for controlling the voltage at the first control node N1. The transistor M7 is coupled between the second control node N2 and the low operation voltage VL and comprises a control electrode coupled to the fourth control node N4. The transistor M7 is turned on or off according to a voltage at the fourth control node N4 for controlling the voltage at the second control node N2. The transistor M8 is coupled between the third control node N3 and the low operation voltage VL and comprises a control electrode coupled to the fourth control node N4. The transistor M8 is turned on or off according to a voltage at the fourth control node N4 for controlling the voltage at the third control node N3.

The input circuit 410 may comprise transistors M9 and M10. The transistor M9 is coupled between the first input terminal IN1 and the fourth control node N4 and comprises a control electrode receiving the control signal CSV. The transistor M10 is coupled between the second input terminal IN2 and the fourth control node N4 and comprises a control electrode receiving the control signal BCSV. The transistors M9 and M10 are respectively turned on or off according to the control signals CSV and BCSV for selectively transmitting the input signal STV or G(2) to the control circuit 420.

The switch circuit 440 may comprise transistors M11 and M12. The transistor M11 is coupled between the second clock input terminal C2 and the fifth control node N5 and comprises a control electrode receiving the control signal CSV. The transistor M12 is coupled between the third clock input terminal C3 and the fifth control node N5 and comprises a control electrode receiving the control signal BCSV. The transistors M11 and M12 are respectively turned on or off according to the control signals CSV and BCSV for selectively transmitting the clock signals CKV2 or CKV4 to the control circuit 420.

FIG. 5 shows the waveforms of the corresponding signals and nodes of a shift register in the forward scan according to the first embodiment of the invention. Similarly, for convenience of illustration, the waveforms as shown are the waveforms of the first stage shift register SR(1). Based on the waveforms shown in FIG. 5, operations in the forward scan of the shift register in the first embodiment of the invention are illustrated in the following paragraphs.

In the forward scan, the transistors M9 and M11 are turned on in response to the voltage level of the control signal CSV. When the start pulse STV arrives, the fourth control node N4 is charged to a high voltage approaching the high operation voltage VH, thereby turning on the transistors M3, M7 and M8. When the transistor M3 is turned on, the first control node N1 is charged to a high voltage VH1 approaching the high operation voltage VH, thereby turning on the transistor M1. When the transistors M7 and M8 are turned on, the second control node N2 and the third control node N3 are discharged to have a voltage level that is the same as the low operation voltage VL.

When a pulse of the clock signal CKV1 arrives, the first control node N1 is further charged to another high voltage VH2 that is higher than the high voltage VH1. Meanwhile, a pulse signal (that is, the gate pulse of the gate driving signal G(1)) is output at the output terminal OUT in response to the pulse of the clock signal CKV1. In addition, since the pulse of the start pulse STV is ended, the fourth control node N4 is discharged to the low operation voltage VL, thereby turning off the transistors M3, M7 and M8.

When the pulse of the clock signal CKV2 arrives, the fifth control node N5 is charged to a high voltage approaching the high operation voltage, thereby turning on the transistor M4. When the transistor M4 is turned on, the second control node N2 is charged to a high voltage VH3 approaching the high operation voltage, thereby turning on the transistor M2. Meanwhile, since the transistors M1 and M2 are turned on, the voltage at the output terminal OUT is discharged through both the transistors M1 and M2 at the same time. Therefore, the falling time $T_f$ of the gate pulse of the gate driving signal G(1) is greatly reduced.

When the pulse of the clock signal CKV3 arrives, the transistor M5 is turned on, and the third control node N3 is charged to the high voltage VH4 approaching the high operation voltage VH, thereby turning on the transistor M6. When the transistor M6 is turned on, the first control node N1 is discharged to the low operation voltage VL, thereby turning off the transistor M1.

Note that in the embodiment of the invention, the voltage levels of the high voltages VH1, VH3 and VH4 may be equal to or a little bit lower than that of the high operation voltage VH. The voltage level of another high voltage VH2 is higher than that of the high operation voltage VH, such that the voltage level of the gate pulse output by the shift register will not have "threshold loss" caused by the threshold voltage of the transistor M1.

Since the shift register 400 generates pulse signal according to the received clock signal only when the transistor M1 is turned on, the high voltage region of the first control node N1 capable of turning on the transistor M1 may be regarded as the voltage region in which the shift register 400 is activated. In other words, in the forward scan, the operation of each shift register is activated in response to the first input signal received at the first input terminal IN1, and is deactivated in response to the clock signal received at the fourth clock input terminal C4. In addition, in this embodiment, when the pulse of the clock signal CKV4 received at the third clock input terminal C3 arrives, the shift register does not respond to it since the transistors M10 and M12 are not turned on at this time.

FIG. 6 shows the waveforms of the corresponding signals and nodes of a shift register in the reverse scan according to the first embodiment of the invention. The waveforms shown in FIG. 6 are the waveforms of the last stage shift register SR(M). Operation of the shift register in the reverse scan is similar to that in the forward scan, and the difference is only in that the pulses of the clock signals CKV4~CKV1 are sequentially generated in a cyclic manner. Those who are skilled in this technology can easily derive the operation of the shift register in the reverse scan according to that in the forward scan as illustrated above, and the related illustration are omitted here for brevity.

FIG. 7 shows a circuit diagram of a shift register circuit according to a second embodiment of the invention. The shift register 700 may be either one of the shift registers SR(1)~SR(M) shown in FIG. 3, and may comprise an input circuit 710, a control circuit 720 and an output circuit 730. For the convenience of illustration, the shift register 700 is regarded as the first stage shift register SR(1).

The input circuit 710 is coupled to a first input terminal IN1 and a second input terminal IN2 for respectively receiving the input signal STV and G(2) (that is, the gate driving signal output by a following stage shift register SR(2)). The output circuit 730 is coupled to the first clock input terminal C1 for receiving the clock signal CKV1 and outputs a pulse signal (that is, the gate pulse of the gate driving signal G(1)) at the output terminal OUT according the clock signal CKV1. The control circuit 720 is coupled to the output circuit 730 through the first control node N1, the second control node N2 and the third control node N3, controls the voltages at the first control node N1, the second control node N2 and the third control node N3 according to the input signal STV or G(2), and further controls the operation of the output circuit 730.

According to an embodiment of the invention, the output circuit 730 may comprise transistors M1, M2 and a capacitor C. The transistor M1 is coupled between the first clock input terminal C1 and the output terminal OUT and comprises a control electrode coupled to the first control node N1. The transistor M2 is coupled between the output terminal OUT and the low operation voltage VL and comprises a control electrode coupled to the second control node N2. The transistor M1 is turned on or off according to a voltage at the first control node N1, and the transistor M2 is turned on or off according to a voltage at the second control node N2.

The input circuit 710 may comprise transistors M23 and M29. The transistor M23 is coupled between the high operation voltage VH and the first control node N1 and comprises a control electrode coupled to the first input terminal IN1. The transistor M23 is turned on or off according to the voltage of the input signal received at the first input terminal IN1 for controlling the voltage at the first control node N1 in the forward scan. The transistor M29 is coupled between the high operation voltage VH and the first control node N1 and comprises a control electrode coupled to the second input terminal IN2. The transistor M29 is turned on or off according to the voltage of the input signal received at the second input terminal IN2 for controlling the voltage at the first control node N1 in the reverse scan.

The control circuit 720 may comprise transistors M24, M25, M26, M27, M28 and M30. The transistor M24 is coupled between the high operation voltage VH and the second control node N2 and comprises a control electrode coupled to the second clock input terminal C2. The transistor M24 is turned on or off according to the voltage of the clock signal received at the second clock input terminal C2 for controlling the voltage at the second control node N2 in the forward scan. The transistor M30 is coupled between the high operation voltage VH and the second control node N2 and comprises a control electrode coupled to the third clock input terminal C3. The transistor M30 is turned on or off according to the voltage of the clock signal received at the third clock input terminal C3 for controlling the voltage at the second control node N2 in the reverse scan.

The transistor M25 is coupled between the high operation voltage VH and the third control node N3 and comprises a control electrode coupled to the fourth clock input terminal C4. The transistor M25 is turned on or off according to the voltage of the clock signal received at the fourth clock input terminal C4 for controlling the voltage at the third control node N3. The transistor M26 is coupled between the second control node N2 and the third control node N3 and comprises a control electrode coupled to the first clock input terminal C1. The transistor M26 is turned on or off according to the voltage of the clock signal received at the first clock input terminal C1 for controlling the voltage at the second control node N2.

The transistor M27 is coupled between the first control node N1 and the low operation voltage VL and comprises a control electrode coupled to the third control node N3. The transistor M27 is turned on or off according to the voltage at the third control node N3 for controlling the voltage at the first control node N1. The transistor M28 is coupled between the third control node N3 and the low operation voltage VL and comprises a control electrode coupled to the first control node N1. The transistor M28 is turned on or off according to the voltage at the first control node N1 for controlling the voltage at the third control node N3.

FIG. 8 shows the waveforms of the corresponding signals and nodes of a shift register in the forward scan according to the second embodiment of the invention. Similarly, for the convenience of illustration, the waveforms as shown in FIG. 8 are the waveforms of the first stage shift register SR(1). Based on the waveforms shown in FIG. 8, operations in the forward scan of the shift register in the second embodiment of the invention are illustrated in the following paragraphs.

When the start pulse STV arrives, the transistor M23 is turned on and the first control node N1 is charged to a high voltage VH1' approaching the high operation voltage VH, thereby turning on the transistors M11 and M28. When the transistor M28 is turned on, the third control node N3 is discharged to have a voltage level that is the same as the low operation voltage VL.

When a pulse of the clock signal CKV1 arrives, the first control node N1 is further charged to another high voltage VH2' that is higher than the high voltage VH1'. Meanwhile, a pulse signal (that is, the gate pulse of the gate driving signal G(1)) is output at the output terminal OUT in response to the pulse of the clock signal CKV1. In addition, the transistor M26 is turned on in response to the pulse of the clock signal CKV1 for discharging the voltage at the second control node N2 to the low operation voltage VL according to the voltage at the third control node N3. In addition, since the pulse of the start pulse STV is ended, the transistor M23 is turned off.

When the pulse of the clock signal CKV2 arrives, the transistor M24 is turned on and the second control node N2 is charged to a high voltage VH3' approaching the high operation voltage, thereby turning on the transistor M2. Meanwhile, since the transistors M1 and M2 are turned on, the voltage at the output terminal OUT is discharged through both the transistors M1 and M2 at the same time. Therefore, the falling time $T_f$ of the gate pulse of the gate driving signal G(1) is greatly reduced.

When the pulse of the clock signal CKV3 arrives, the transistor M25 is turned on, and the third control node N3 is charged to the high voltage VH4' approaching the high operation voltage VH, thereby turning on the transistor M27. When the transistor M27 is turned on, the first control node N1 is discharged to the low operation voltage VL, thereby turning off the transistor M1.

Note that in the embodiment of the invention, the voltage levels of the high voltages VH1', VH3' and VH4' may be equal to or a little bit lower than that of the high operation voltage VH. The voltage level of another high voltage VH2' is higher than that of the high operation voltage VH, such that the voltage level of the gate pulse output by the shift register will not have "threshold loss" caused by the threshold voltage of the transistor M1.

In addition, when the gate pulse of the gate driving signal G(2) of the following stage shift register SR(2) arrives, the transistor M29 is turned on. However, the shift register does not respond to the gate pulse of the gate driving signal G(2) since the first control node N1 still has a high voltage level.

Since the shift register 700 generates the pulse signal according to the received clock signal only when the transistor M1 is turned on, the high voltage region of the first control node N1 capable of turning on the transistor M1 may be regarded as the voltage region in which the shift register 700 is activated. In other words, in the forward scan, the operation of each shift register is activated in response to the first input signal received at the first input terminal IN1, and is deactivated in response to the clock signal received at the fourth clock input terminal C4. In addition, when the pulse of the clock signal CKV4 received at the third clock input terminal C3 arrives, since the shift register is deactivated at this time, the shift register does not respond to it. In this manner, compared to the structure in the first embodiment, in the second embodiment, there is no need to use the control signals CSV and BCSV to define the scan direction and the scan direction can be naturally defined according to the sequence of generating the clock signals CKV1~CKV4.

FIG. 9 shows the waveforms of the corresponding signals and nodes of a shift register in the reverse scan according to the second embodiment of the invention. The waveforms shown in FIG. 9 are the waveforms of the last stage shift register SR(M). Operation of the shift register in the reverse scan is similar to that in the forward scan, and the difference is only in that the pulses of the clock signals CKV4~CKV1 are sequentially generated in a cyclic manner. Those who are skilled in this technology can easily derive the operation of the shift register in the reverse scan according to that in the forward scan as illustrated above, and the related illustrations are omitted here for brevity.

As discussed above, in the embodiments of the invention, since the voltage at the output terminal OUT is discharged through both the transistors M1 and M2 at the same time, the falling time $T_f$ of the gate pulse of the gate driving signal G(1) is greatly reduced. In addition, compared to the conventional design in which the size of the transistor M1 cannot be reduced since the voltage at the output terminal is discharged only through the transistor M1, in the embodiment of the invention, the size of the transistor M1 can be reduced since the voltage at the output terminal OUT is discharged through both the transistors M1 and M2 at the same time.

Moreover, unlike the conventional design, in which the size (that is, the width-to-length ratio W/L, or the width when the length of the transistors is fixed) of the transistor M1 must be greater than that of the transistor M2, in the embodiments of the invention, the size (that is, the W/L or width) of the transistor M1 can be smaller than that of the transistor M2. In addition, in the embodiments of the invention, the sizes of both the transistors M1 and M2 can be smaller than that of the transistors M1 and M2 of a conventional design. In this manner, the circuit area of the shift register can be greatly reduced, and the power consumption of the shift register can also be greatly reduced.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of embodiment, it is to be understood that the invention is not limited thereto. Those who are skilled in this technology can still make various alterations and modifications without departing from the scope and spirit of this invention. Therefore, the scope of the invention shall be defined and protected by the following claims and their equivalents.

What is claimed is:
1. A display panel, comprising:
   a gate driving circuit, comprising a plurality of shift registers coupled in serial, wherein at least one of the shift registers comprises:
   an input circuit, coupled to a first input terminal and a second input terminal for respectively receiving a first input signal and a second input signal;

an output circuit, coupled to a first clock input terminal for receiving a first clock signal and outputting a pulse signal at an output terminal according to the first clock signal;

a control circuit, coupled to the output circuit via a first control node, a second control node and a third control node and controlling voltages at the first control node, the second control node and the third control node according to the first input signal or the second input signal, and further controlling operations of the output circuit; and a switch circuit, coupled to a second clock input terminal and a third clock input terminal for receiving a second clock signal and a third clock signal, wherein when the shift register operates in a forward scan, the switch circuit transmits the second clock signal to the control circuit, and when the shift register operates in a reverse scan, the switch circuit transmits the third clock signal to the control circuit.

2. The display panel as claimed in claim 1, wherein the control circuit is further coupled to a second clock input terminal and a third clock input terminal for receiving a second clock signal and a third clock signal.

3. The display panel as claimed in claim 2, wherein the input circuit comprises:
a third transistor, coupled to a high operation voltage, the first input terminal and the first control node, and
wherein the control circuit comprises:
a fourth transistor, coupled to the high operation voltage, the second clock input terminal and the second control node; and
a fifth transistor, coupled to the high operation voltage, a fourth clock input terminal and the third control node,
wherein the third transistor is turned on or off according to a voltage of the first input signal for controlling the voltage at the first control node, the fourth transistor is turned on or off according to a voltage of the second clock signal for controlling the voltage at the second control node, and the fifth transistor is turned on or off according to a voltage of a fourth clock signal for controlling the voltage at the third control node.

4. The display panel as claimed in claim 3, wherein the control circuit further comprises:
a sixth transistor, coupled to the second control node, the first clock input terminal and the third control node;
a seventh transistor, coupled to the first control node, the third control node and a low operation voltage; and
an eighth transistor, coupled to the third control node, the first control node and the low operation voltage,
wherein the sixth transistor is turned on or off according to a voltage of the first clock signal for controlling the voltage at the second control node, the seventh transistor is turned on or off according to the voltage at the third control node for controlling the voltage at the first control node and the eighth transistor is turned on or off according to the voltage at the first control node for controlling the voltage at the third control node.

5. The display panel as claimed in claim 4, wherein the input circuit further comprises:
a ninth transistor, coupled to the high operation voltage, the second input terminal and the first control node, and
wherein the control circuit further comprises:
a tenth transistor, coupled to the high operation voltage, the third clock input terminal and the second control node.

6. The display panel as claimed in claim 1, wherein the output circuit comprises:

a first transistor, coupled to the first clock input terminal, the first control node and the output terminal; and
a second transistor, coupled to the output terminal, the second control node and a low operation voltage,
wherein the first transistor is turned on or off according to the voltage at the first control node and the second transistor is turned on or off according to the voltage at the second control node, and
wherein after outputting the pulse signal, a voltage at the output terminal is discharged through the first transistor and the second transistor.

7. The display panel as claimed in claim 6, wherein a width of the second transistor is greater than a width of the first transistor.

8. The display panel as claimed in claim 1, wherein the control circuit comprises:
a third transistor, coupled to a high operation voltage, a fourth control node and the first control node;
a fourth transistor, coupled to the high operation voltage, a fifth control node and the second control node; and
a fifth transistor, coupled to the high operation voltage, a fourth clock input terminal and the third control node,
wherein the third transistor is turned on or off according to a voltage at the fourth control node for controlling the voltage at the first control node, the fourth transistor is turned on or off according to a voltage at the fifth control node for controlling the voltage at the second control node, and the fifth transistor is turned on or off according to a voltage of a fourth clock signal for controlling the voltage at the third control node.

9. The display panel as claimed in claim 8, wherein the control circuit further comprises:
a sixth transistor, coupled to the first control node, the third control node and a low operation voltage;
a seventh transistor, coupled to the second control node, the fourth control node and the low operation voltage; and
an eighth transistor, coupled to the third control node, the fourth control node and the low operation voltage,
wherein the sixth transistor is turned on or off according to the voltage at the third control node for controlling the voltage at the first control node, the seventh transistor is turned on or off according to a voltage at the fourth control node for controlling the voltage at the second control node and the eighth transistor is turned on or off according to the voltage at the fourth control node for controlling the voltage at the third control node.

10. The display panel as claimed in claim 1, wherein each shift register receives at least four clock signals, and wherein a rising edge of one of the clock signals is close to a falling edge of another of the clock signals.

11. A bi-directional shift register circuit for generating a plurality of gate driving signals and comprising a plurality of shift registers, wherein at least one shift register comprises:
an input circuit, coupled to a first input terminal and a second input terminal for respectively receiving a first input signal and a second input signal;
an output circuit, coupled to a first clock input terminal for receiving a first clock signal and outputting a pulse signal at an output terminal according to the first clock signal; a control circuit, coupled to the output circuit via a first control node, a second control node and a third control node and controls voltages at the first control node, the second control node and the third control node according to the first input signal or the second input signal, and further controls operations of the output circuit; a second clock input terminal, receiving a second clock signal; and a third clock input terminal, receiving a third clock signal, wherein when the shift register operates in a forward scan, a falling edge of the first clock signal is close to a rising edge of the second clock signal, and when the shift register operates in a reverse scan, the falling of the first clock signal is close to a rising edge of the third clock signal and wherein the output circuit comprises: a first transistor, coupled to the first clock input terminal the first control node and the output terminal and a second transistor, coupled to the output terminal the second control node and a low operation voltage, wherein the first transistor is turned on or off according to the voltage at the first control node and the second transistor is turned on or off according to the voltage at the second control node, and wherein after outputting the pulse signal, a voltage at the output terminal is discharged through the first transistor and the second transistor, wherein a width of the second transistor is greater than a width of the first transistor.

12. The bi-directional shift register circuit as claimed in claim 11, wherein the shift register further comprises:
a switch circuit, coupled to the second clock input terminal and the third clock input terminal for receiving the second clock signal and the third clock signal, wherein when the shift register operates in a forward scan, the switch circuit transmits the second clock signal to the control circuit, and when the shift register operates in a reverse scan, the switch circuit transmits the third clock signal to the control circuit.

13. The bi-directional shift register circuit as claimed in claim 12, wherein the input circuit comprises:
a third transistor, coupled to a high operation voltage, the first input terminal and the first control node, and
wherein the control circuit comprises:
a fourth transistor, coupled to the high operation voltage, the second clock input terminal and the second control node; and
a fifth transistor, coupled to the high operation voltage, a fourth clock input terminal and the third control node,
wherein the third transistor is turned on or off according to a voltage of the first input signal for controlling the voltage at the first control node, the fourth transistor is turned on or off according to a voltage of the second clock signal for controlling the voltage at the second control node, and the fifth transistor is turned on or off according to a voltage of a fourth clock signal for controlling the voltage at the third control node.

14. The bi-directional shift register circuit as claimed in claim 13, wherein the control circuit further comprises:
a sixth transistor, coupled to the second control node, the first clock input terminal and the third control node;
a seventh transistor, coupled to the first control node, the third control node and a low operation voltage; and
an eighth transistor, coupled to the third control node, the first control node and the low operation voltage,
wherein the sixth transistor is turned on or off according to a voltage of the first clock signal for controlling the voltage at the second control node, the seventh transistor is turned on or off according to the voltage at the third control node for controlling the voltage at the first control node and the eighth transistor is turned on or off according to the voltage at the first control node for controlling the voltage at the third control node.

15. The bi-directional shift register circuit as claimed in claim 14, wherein the input circuit further comprises:
a ninth transistor, coupled to the high operation voltage, the second input terminal and the first control node, and
wherein the control circuit further comprises:
a tenth transistor, coupled to the high operation voltage, the third clock input terminal and the second control node.

16. The bi-directional shift register circuit as claimed in claim 11, wherein the control circuit comprises:
a third transistor, coupled to a high operation voltage, a fourth control node and the first control node:
a fourth transistor, coupled to the high operation voltage, a fifth control node and the second control node; and
a fifth transistor, coupled to the high operation voltage, a fourth clock input terminal and the third control node,
wherein the third transistor is turned on or off according to a voltage at the fourth control node for controlling the voltage at the first control node, the fourth transistor is turned on or off according to a voltage at the fifth control node for controlling the voltage at the second control node, and the fifth transistor is turned on or off according to a voltage of a fourth clock signal for controlling the voltage at the third control node.

17. The bi-directional shift register circuit as claimed in claim 16, wherein the control circuit further comprises:
a sixth transistor, coupled to the first control node, the third control node and a low operation voltage;
a seventh transistor, coupled to the second control node, the fourth control node and the low operation voltage; and
an eighth transistor, coupled to the third control node, the fourth control node and the low operation voltage,
wherein the sixth transistor is turned on or off according to a voltage at the third control node for controlling the voltage at the first control node, the seventh transistor is turned on or off according to the voltage at the fourth control node for controlling the voltage at the second control node and the eighth transistor is turned on or off according to the voltage at the fourth control node for controlling the voltage at the third control node.

* * * * *